US009475145B2

(12) United States Patent
Yang et al.

(10) Patent No.: US 9,475,145 B2
(45) Date of Patent: Oct. 25, 2016

(54) SOLDER BUMP JOINT IN A DEVICE INCLUDING LAMELLAR STRUCTURES

(71) Applicant: TAIWAN SEMICONDUCTOR MANUFACTURING COMPANY, LTD., Hsinchu (TW)

(72) Inventors: Su-Chun Yang, Hsinchu (TW); Chung-Jung Wu, Tainan (TW); Hsiao-Yun Chen, Hsinchu (TW); Yi-Li Hsiao, Hsinchu (TW); Chih-Hang Tung, Hsinchu (TW); Da-Yuan Shih, Hsinchu (TW); Chen-Hua Yu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 167 days.

(21) Appl. No.: 13/826,362

(22) Filed: Mar. 14, 2013

(65) Prior Publication Data
US 2013/0221521 A1      Aug. 29, 2013

Related U.S. Application Data

(63) Continuation-in-part of application No. 13/406,198, filed on Feb. 27, 2012, now abandoned.

(51) Int. Cl.
*H01L 23/48*        (2006.01)
*H01L 23/52*        (2006.01)
(Continued)

(52) U.S. Cl.
CPC ....... *B23K 1/0016* (2013.01); *H01L 23/49811* (2013.01); *H01L 24/16* (2013.01); *H01L 24/81* (2013.01); *H01L 24/13* (2013.01); *H01L 2224/1132* (2013.01); *H01L 2224/1134* (2013.01); *H01L 2224/1145* (2013.01); *H01L 2224/11334* (2013.01); *H01L 2224/11462* (2013.01); *H01L 2224/131* (2013.01); *H01L 2224/13014* (2013.01);
(Continued)

(58) Field of Classification Search
CPC .......... H01L 2924/01029; H01L 2924/01079
USPC ......... 257/737, 738, 778, 734; 438/464, 613
See application file for complete search history.

(56) References Cited

U.S. PATENT DOCUMENTS 4,878,611 A * 11/1989 LoVasco et al. ......... 228/180.22
5,441,195 A *  8/1995 Tustaniwskyj et al. . 228/180.22
(Continued)

FOREIGN PATENT DOCUMENTS

JP        2-206138       8/1990
JP       11-111764       4/1999
(Continued)

OTHER PUBLICATIONS

Office Action dated Jun. 5, 2014 and English translation from corresponding No. KR 10-2013-0073073.
(Continued)

*Primary Examiner* — Lex Malsawma
*Assistant Examiner* — Eric Jones
(74) *Attorney, Agent, or Firm* — Hauptman Ham, LLP (57) ABSTRACT

A method includes heating a solder bump above a melting temperature of the solder bump. The solder bump is stretched to increase a height of the solder bump. The solder bump is cooled down to form a solder bump joint in an electrical device.

20 Claims, 12 Drawing Sheets

(51) Int. Cl.
  *H01L 29/40* (2006.01)
  *B23K 1/00* (2006.01)
  *H01L 23/498* (2006.01)
  *H01L 23/00* (2006.01)

(52) U.S. Cl.
  CPC ........... *H01L 2224/13111* (2013.01); *H01L 2224/13139* (2013.01); *H01L 2224/13147* (2013.01); *H01L 2224/16057* (2013.01); *H01L 2224/16058* (2013.01); *H01L 2224/16145* (2013.01); *H01L 2224/16225* (2013.01); *H01L 2224/16227* (2013.01); *H01L 2224/16506* (2013.01); *H01L 2224/16507* (2013.01); *H01L 2224/8193* (2013.01); *H01L 2224/81121* (2013.01); *H01L 2224/81191* (2013.01); *H01L 2224/81815* (2013.01); *H01L 2924/01322* (2013.01)

(56) References Cited

U.S. PATENT DOCUMENTS

| | | | |
|---|---|---|---|
| 5,968,670 | A | 10/1999 | Brofman et al. |
| 6,427,901 | B2 * | 8/2002 | Dautartas ................. 228/180.22 |
| 6,550,665 | B1 * | 4/2003 | Parrish et al. ........... 228/180.22 |
| 6,890,795 | B1 | 5/2005 | Wong et al. |
| 2001/0002982 | A1 * | 6/2001 | Sarkhel ................ B23K 35/262 420/590 |
| 2005/0260095 | A1 * | 11/2005 | Hasegawa ............ B23K 35/262 420/562 |
| 2007/0152331 | A1 * | 7/2007 | Kang .................. B23K 35/025 257/737 |
| 2007/0228109 | A1 * | 10/2007 | Smith .................. B23K 35/262 228/176 |
| 2009/0197103 | A1 * | 8/2009 | Shih ..................... B23K 1/0016 428/457 |
| 2009/0197114 | A1 * | 8/2009 | Shih ..................... B23K 1/0016 428/647 |
| 2009/0294409 | A1 * | 12/2009 | Ho et al. .................... 219/85.15 |
| 2010/0203353 | A1 * | 8/2010 | Anderson et al. ............ 428/646 |

FOREIGN PATENT DOCUMENTS

| | | |
|---|---|---|
| JP | 2001-332583 | 11/2001 |
| TW | 201137963 | 11/2011 |

OTHER PUBLICATIONS

Davis, E. M., et al., "Solid Logic Technology: Versatile, High-Performance Microelectronics," IBM Journal, Apr. 1964, pp. 102-114.

Rajoo, R., et al., "Super Stretched Solder Interconnects for Wafer Level Packaging," Electronic Components and Technology Conference, 2006, pp. 1227-1232.

Wang, Yiwei, et al., "Effect of Sn Grain Structure on Electromigration Reliability of Pb-Free Solders," Electronic Components and Technology Conference, 2011, pp. 711-716.

Office Action dated Dec. 2, 2014 and English translation from corresponding No. KR 10-2013-0073073.

Office Action dated Jul. 21, 2015 and English translation from corresponding No. KR 10-2013-0073073.

Office Action dated Jun. 17, 2015 from corresponding No. TW 102102788.

Office Action dated May 3, 2016 and English translation from corresponding No. KR 10-2016-0025707.

\* cited by examiner

SOLDER BUMP JOINT IN A DEVICE INCLUDING LAMELLAR STRUCTURES

CROSS-REFERENCE TO RELATED APPLICATIONS

The present application is a continuation-in-part and claims the priority of U.S. patent application Ser. No. 13/406,198, filed on Feb. 27, 2012, the disclosure of which is hereby incorporated herein by reference in its entirety.

TECHNICAL FIELD

The present disclosure relates generally to an integrated circuit and more particularly to a solder bump.

BACKGROUND

Solder bumps, used in flip-chip solder joints for example, are usually assembled by aligning and placing a chip on a substrate, then reflowing the solder bumps in a conveyer oven. The grain orientation of the solder bump element, e.g., Sn, could not be controlled, and the reflowed solder joint has random grain orientation. Depending on the local grain orientation around a joint between a solder bump and a conductive pad or an under bump metal (UBM), early failure may occur at the joint due to solder material dissolution caused by, for example, electromigration (EM).

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity of identification of corresponding objects and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
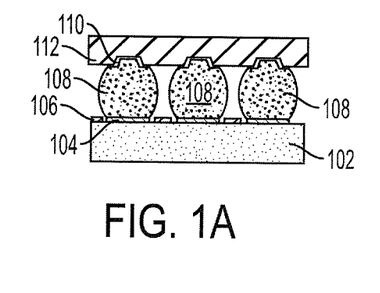
FIGS. 1A-1E are cross-sectional views of an exemplary solder bump at various intermediate steps of a solder bump stretching process according to some embodiments.

FIGS. 1A-1E are cross-sectional views of an exemplary solder bump at various intermediate steps of a solder bump stretching process according to some embodiments. In FIG. 1A, a substrate 102 is joined with a top die 112 after a reflow process of the solder bumps 108. The substrate 102 is shown with pads 104 for electrical connections using solder bumps 108. The substrate 102 provides support for the electrical connections to a top die 112 through the solder bumps 108. The substrate 102 can be, for example, a silicon substrate, an interposer, another die, or a printed circuit board (PCB). The pads 104 formed over the substrate 102 comprise electrically conductive material, such as metal (copper, aluminum, etc.).

A solder mask 106 disposed over the substrate 102 provides a protective coating, e.g., for the copper traces on the substrate 102, and prevents solder bumps 108 from bridging conductors, thereby preventing short circuits. The solder mask 106 can be liquid photo-imageable solder mask (LPSM) or dry film photo-imageable solder mask (DFSM), and comprises epoxy, or a lacquer-like layer of polymer in some embodiments.

The solder bumps 108 disposed over the substrate 102 and pads 104 can be micro bumps, ball grid array (BGA) solder balls, or any other suitable solder structure. For example, some micro bumps has a diameter of about 2 µm-120 µm, and some BGA solder balls has a diameter of about 100 µm-500 µm in some embodiments. The solder bumps 108 comprise solder materials such as Sn, Ag, Cu, any combination there of, or any other suitable material.

Solder bumps 108 can be formed or placed on under bump metal (UBM) 110 in many ways, including evaporation, electroplating, printing, jetting, stud bumping, direct placement, or any other suitable method. The UBM 110 facilitates soldering using solder bumps 108 for electrical connections to the top die 112. The pads 104, solder mask 106, solder bumps 108, and UBM 110 can be fabricated using any suitable processes and/or materials known in the art.

Figure 1B:
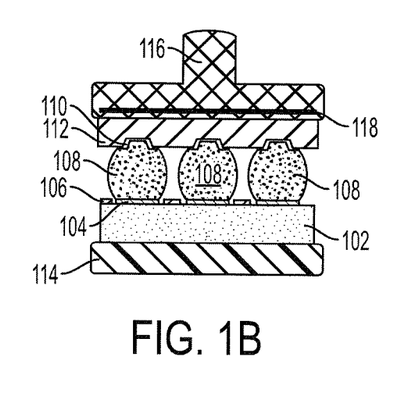

In FIG. 1B, the package including the substrate 102 and the top die 112 is then placed in a thermal compression bonder (TCB). The top holder (i.e., bonder head) 116 of the TCB is bonded to the top die 112 above the solder bumps 108 and a bottom holder 114 of the TCB is bonded to the substrate 102 below the solder bumps 108. The bonding of the top holder 116 and the top die 112 and the bonding of the bottom holder 114 and the substrate 102 can be performed by vacuum suction, for example. Then the solder bumps 108 are heated above the melting temperature of the solder bumps 108 by using a heat element 118 in the top holder 116. In one example, the solder bumps 108 are heated above 300° C. The heat element 118 can be an electrical wire, for example. In some embodiments, the heating temperature is above the melting point of the solder used. In some embodiments, the temperature profile can be controlled separately on the two sides of the solder bumps 108, and/or by leaving the bottom holder 114 at a room temperature.

Figure 1C:
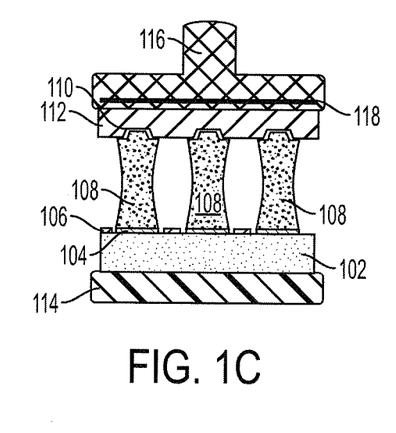

In FIG. 1C, the top holder 116 and the bottom holder 114 of the TCB are used to pull the top die 112 to a controlled height, and the shape of molten solder bumps 108 is simultaneously changed. The solder bumps 108 are stretched to manipulate and change the shape, height, and microstructure, e.g., to increase the height of the solder bumps 108. Even though the top holder 116 and the bottom holder 114 of the TCB are used to stretch the solder bump 108 to increase its height, any other suitable method can be used in other embodiments.

Figure 1D:
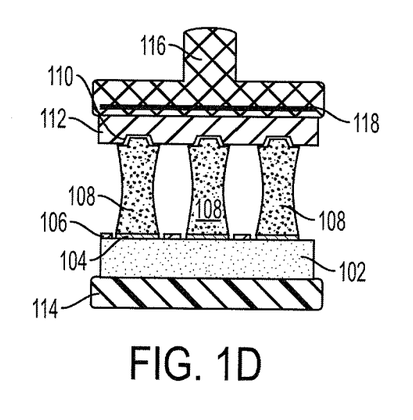
Figure 1E:
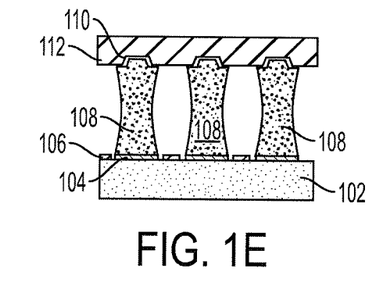

In FIG. 1D, the heat in the top holder 116 is stopped or removed to allow the solder bumps 108 to solidify. The solder bumps 108 are allowed to cool down in a controlled manner. In one example, the solder bumps 108 are cooled down at a room temperature. In FIG. 1E, the top holder 116 and the bottom holder 114 are removed.

Figure 2:
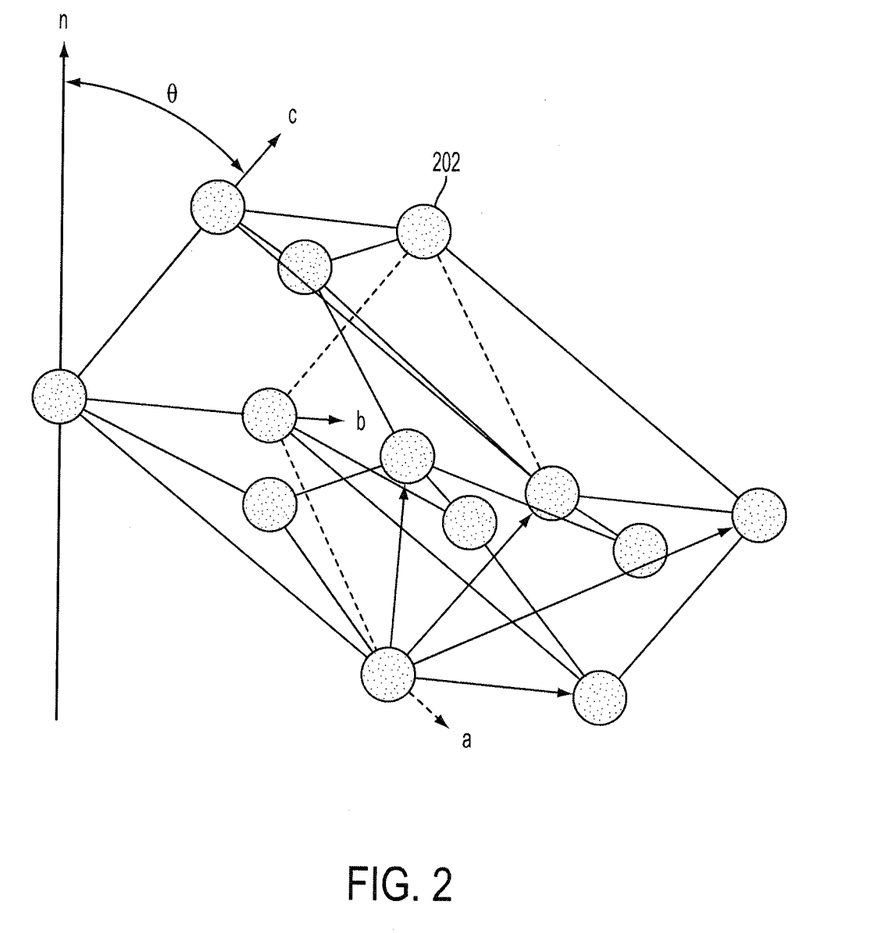
FIG. 2 is a diagram of grain orientation angle of an exemplary solder bump element crystal such as Sn.

After the stretching process in FIGS. 1A-1E, solder bumps 108 have an increased grain orientation angle. FIG. 2 is a diagram of the grain orientation angle of an exemplary solder bump element crystal such as β-Sn. As shown in FIG. 2, the grain orientation angle θ is the angle between the short crystal axis (c-axis) of the main element 202 (of the solder bumps 108 in FIGS. 1A-1E) and the normal n-axis (of the substrate 102 or of the pad 104 in FIGS. 1A-1E), which is the current flow direction. Long crystal axis, i.e., a-axis and b-axis, are also shown in FIG. 2 for references.

The n-axis can be considered as the current flow direction, and a small grain orientation angle θ between the c-axis and the n-axis can facilitate a fast atomic migration and result in an earlier EM failure. In some embodiments, the main element of the solder bumps 108 is Sn and the increased orientation angle after the stretching process in FIGS. 1A-1E is above 50°. A microanalysis technique such as Electron Backscatter Diffraction (EBSD) can be used with electron microscopes to determine the crystal structure of the sample and estimate the grain orientation angle.

Figure 3:
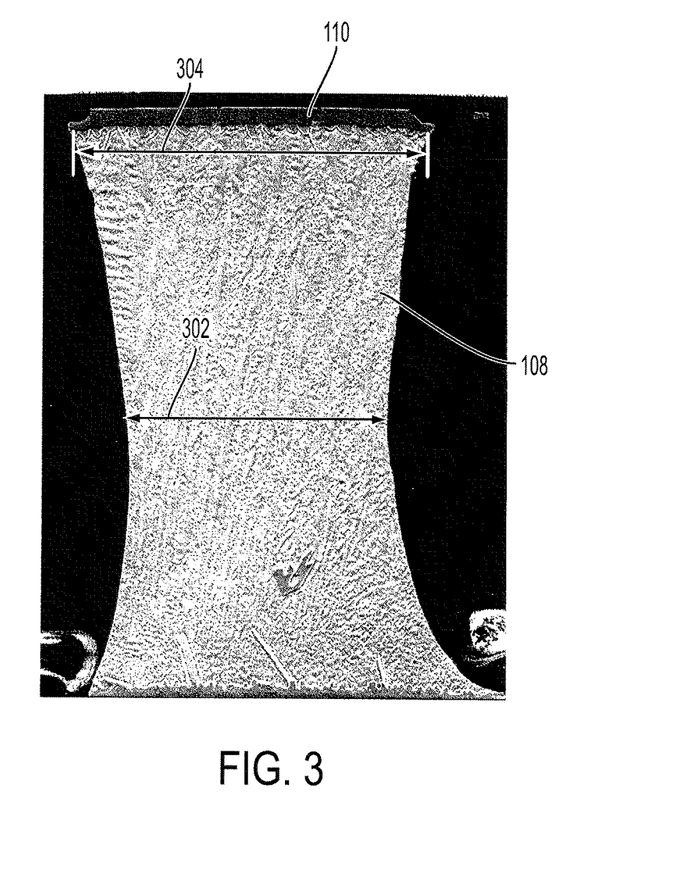
FIG. 3 is a scanning electron microscope (SEM) micrograph of an exemplary cross-sectioned solder bump stretched by the process in FIGS. 1A-1E according to some embodiments.

FIG. 3 is a picture of an exemplary solder bump 108 stretched by the process in FIGS. 1A-1E according to some embodiments. The ratio of the center width 302 of the solder bump 108 over the top contact width 304 of the solder bump 108 is from 0.6 to 1.0 after the stretching in some embodiments. In one example, a solder bump 108 having a height of about 160 μm is stretched to the height of about 260 μm and the ratio of the center width 302 (about 170 μm) over the top contact width 304 (about 240 μm) is about 0.7.

Also, the solder bump 108 has an increased portion of a lamellar structure (a thin plate or pillar-like structure) after the stretching process, as shown in FIG. 3. The lamellar structure can reduce crack propagation because the grain boundaries are close to vertical relative to a horizontal crack propagation direction. In FIG. 3, coarse dendrites are also observed. Even though an hour-glass shape (having a longer top width than the center width) is shown in FIG. 3, different shapes are possible, including column or cylinder-shape, a barrel shape, or ball shape, etc., by using different solder volume or different controlled stretching height.

The stretching process described in FIGS. 1A-1E can also improve thermal mechanical reliability of solder bump joints. The increased height and/or the hour-glass shape in some embodiments effectively reduce the strain in the solder bumps 108. In some exemplary embodiments, the fatigue life of solder bumps 108 using the stretching method in FIGS. 1A-1E was enhanced up to 4-5 times compared to solder bumps 108 without stretching.

Figure 4A:
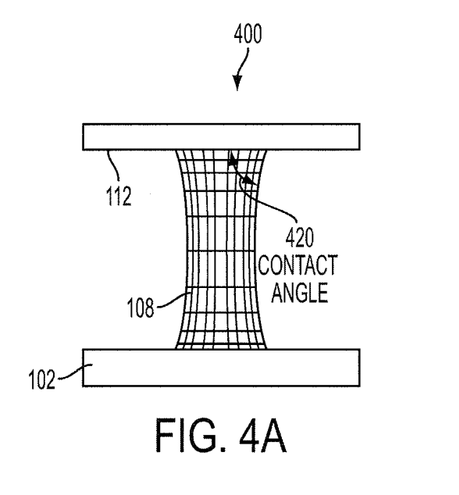
FIGS. 4A-4D are side views of an exemplary solder bump at various intermediate steps of a solder bump stretching process to form a solder bump joint in an electrical device according to some embodiments.
Figure 4B:
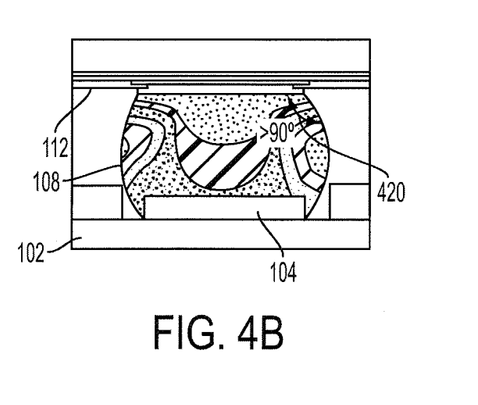
Figure 4C:
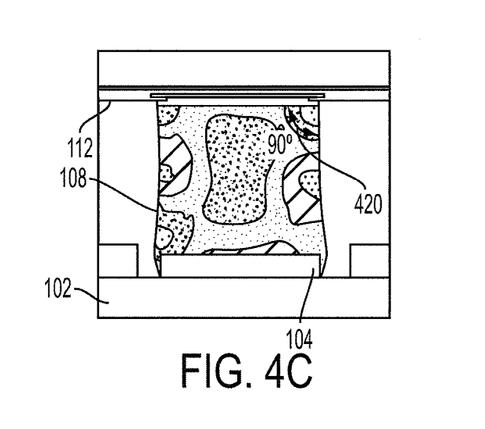
Figure 4D:
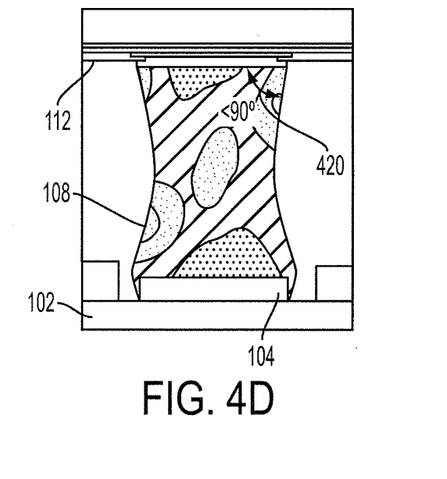

FIGS. 4A-4D are side views of an exemplary solder bump 400 at various intermediate steps of a solder bump stretching process to form a solder bump joint in an electrical device according to some embodiments. The substrate 102 is jointed with the top die 112 after a reflow process of a single solder bump 108. In FIG. 4A, a contact angle 420 is an angle encompassed by the solder bump 108 as measured between the top die 112 and an outer surface of solder bump 108, in some embodiments. In other embodiments, the contact angle 420 is an angle encompassed by a solder bump 108 as measured between the pad 104 (see FIGS. 4B-4D) on the substrate 102 and the outer surface of solder bump 108. The contact angle is measured from points equidistant from a common vertex where solder bump 108 and top die 112 or pad 104 meet. The substrate 102 supports a single pad 104 for electrical connection using solder bump 108. For example, in FIG. 4B, the contact angle 420 between the top die 112 and the outer surface of solder bump 108 is greater than 90°. In FIG. 4C, the contact angle 420 between the top die 112 and the outer surface of solder bump 108 is equal to 90°. In FIG. 4D, the contact angle 420 between the top die 112 and the outer surface of solder bump 108 is less than 90°.

Figure 5A:
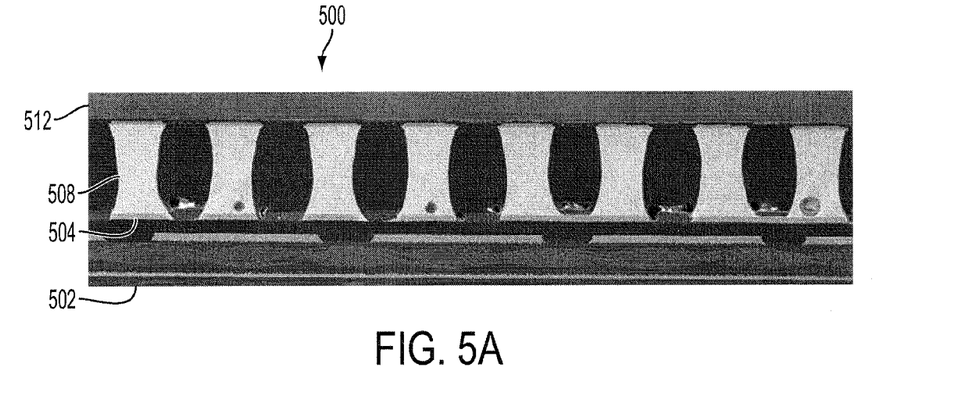
FIGS. 5A and 5B are SEM micrographs of exemplary solder bumps stretched by the process in FIGS. 1A-1E according to some embodiments.
Figure 5B:
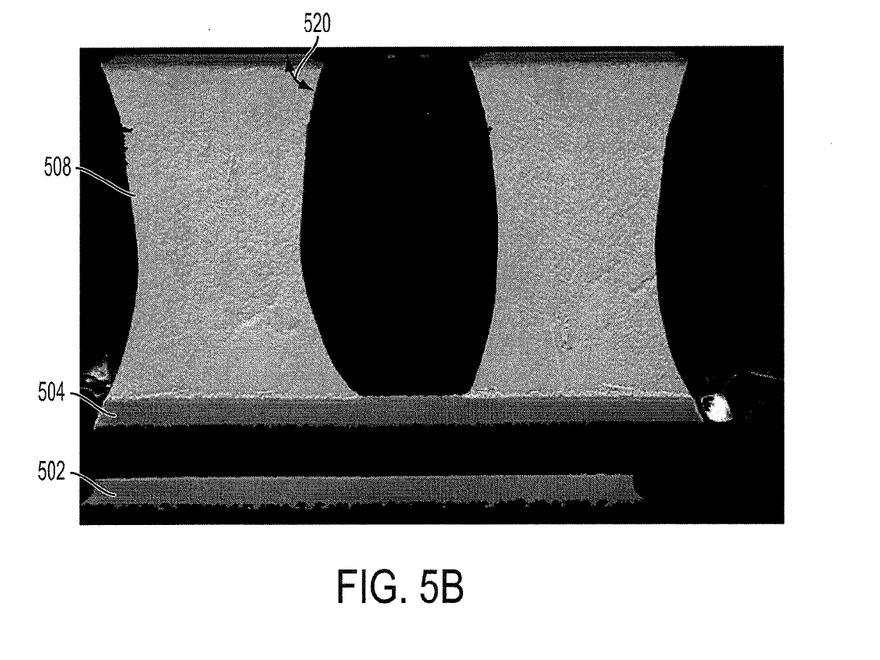

FIGS. 5A and 5B are scanning electron microscope (SEM) micrographs of exemplary solder bumps stretched by the process in FIGS. 1A-1E according to some embodiments. A coupled electronic structure 500 includes solder bumps 508 disposed between pads 504 supported by a substrate 502 and a top die 512. For clarity, FIG. 5B is an expanded portion of FIG. 5A, having a contact angle 520 of less than 90°. In some embodiments, the contact angle 520 varies depending on the configuration of the pads 504, quantity of solder used to form the solder bumps 508 and a distance between the pads 504 and the top die 512. In some embodiments, the surface finish of pads 504 is at least one of copper (Cu), silver (Ag), electroless nickel immersion gold (ENIG) and electroless nickel electroless palladium immersion gold (ENEPIG).

Figure 6A:
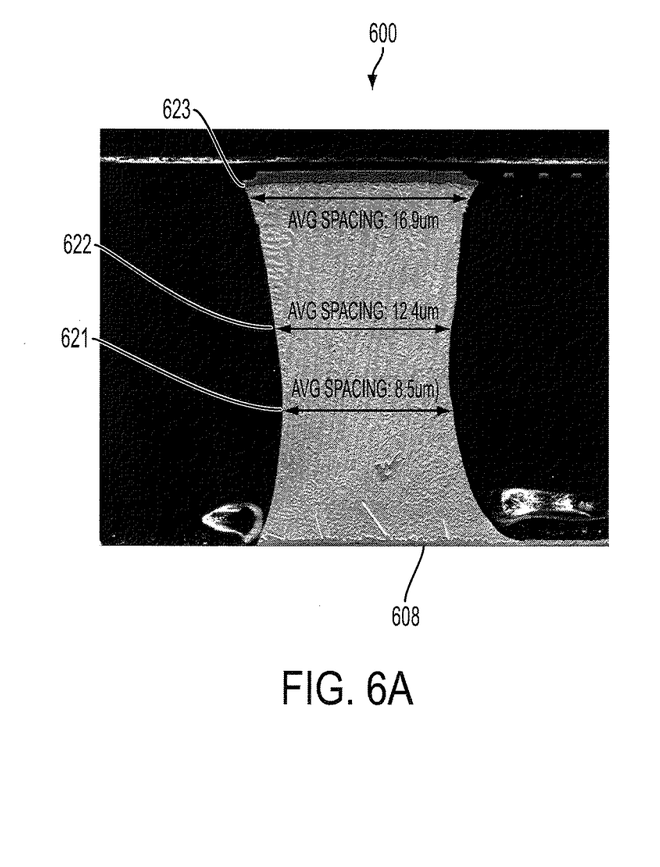
FIGS. 6A and 6B are SEM micrographs of cross-sectioned portions of an exemplary solder bump stretched by the process in FIGS. 1A-1E according to some embodiments.
Figure 6B:
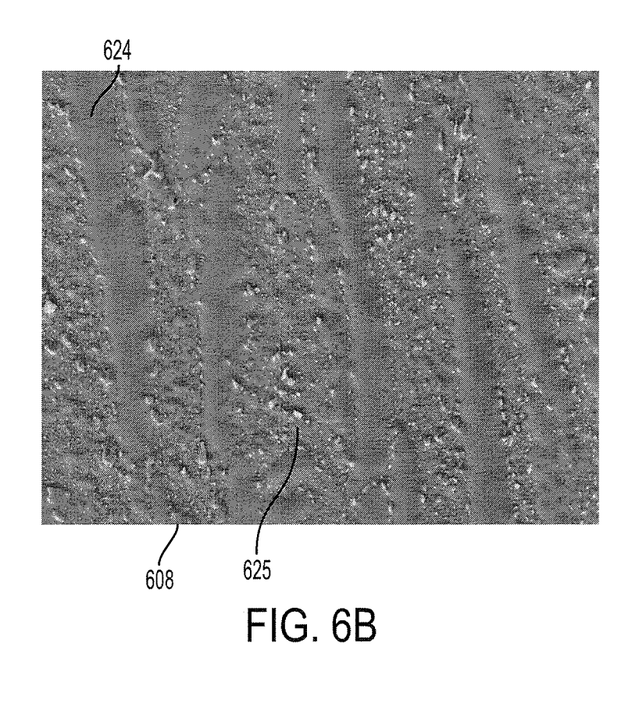

FIGS. 6A and 6B are SEM micrographs 600 of cross-sectioned portions of an exemplary solder bump stretched by the process in FIGS. 1A-1E according to some embodiments. The SEM micrograph of FIG. 6A was taken by a scanning electron microscope (SEM) from a cross-sectioned solder bump 608. The cross-sectioned solder bump 608 has an average center width spacing 621 of 8.5 micrometers (μm), an average middle width spacing 622 of 12.4 m and an average top contact width spacing 623 of 16.9 μm. The SEM micrograph 600 of FIG. 6B was taken at increased magnification as compared to FIG. 6A. In some embodiments, the solder bump 608 is a eutectic alloy that includes beta crystal phase (t) tin (Sn) 624 and beta crystal phase (β) tin (Sn) with copper (Cu) and silver (Ag) 625. In some embodiments the β-Sn with Cu and Ag 625 is β-Sn+$Cu_6Sn_5$+$Ag_3Sn$.

Referring to both FIG. 6A and FIG. 6B, the solder bump 608 forms an elongated solder bump joint between the substrate 102 and top die 112 as shown in FIGS. 4A-4D. In various embodiments the solder bump 608 includes one or more of Sn—Cu, Sn—Ag, Sn—Ag—Cu, Sn-zinc (Zn), or Sn-bismuth (Bi). More solder combinations are also envisioned in other embodiments, some of which include nickel (Ni) and/or gold (Au). In SEM micrographs 600, a darker-appearing lamellar structure is a Sn-rich phase greater than 90% Sn and a lighter-appearing lamellar structure is Sn plus various intermetallic compounds (IMCs). In some embodiments the IMC is at least one of $Cu_6Sn_5$, $Ag_3Sn$, $Ni_3Sn_4$ and $AuSn_4$.

Figure 7:
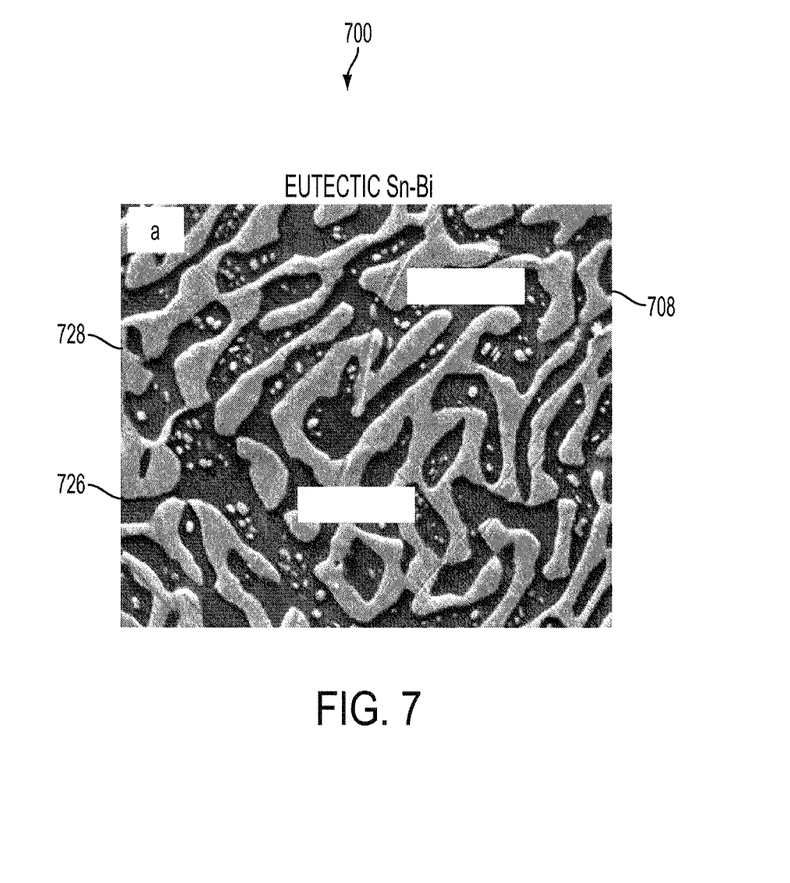
FIG. 7 is an SEM micrograph of a cross-sectioned portion of another exemplary solder bump stretched by the process in FIGS. 1A-1E according to some embodiments.

FIG. 7 is an SEM micrograph 700 of a cross-sectioned portion of another exemplary solder bump 708 stretched by the process in FIGS. 1A-1E according to some embodiments. The solder bump 708 is a lead-free eutectic alloy of tin (Sn) and bismuth (Bi). In the SEM micrograph 700, a darker-appearing lamellar structure is a Sn-rich phase 726 and a lighter-appearing lamellar structure is a Bi-rich phase 728.

Figure 8:
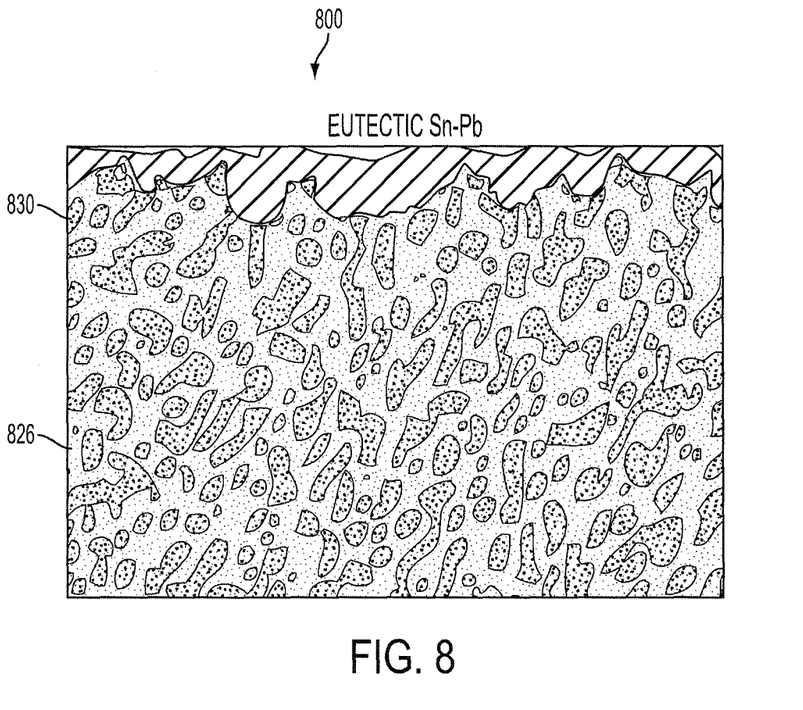
FIG. 8 is an SEM micrograph of a cross-sectioned portion of yet another exemplary solder bump stretched by the process in FIGS. 1A-1E according to some embodiments.

FIG. 8 is an SEM micrograph 800 of a cross-sectioned portion of yet another exemplary solder bump 808 stretched by the process in FIGS. 1A-1E according to some embodiments. The solder bump 808 contains lead and thus is not a lead-free eutectic alloy of tin (Sn) and lead (Pb). In the SEM micrograph 800, a darker-appearing lamellar structure is a Sn-rich phase 826 and a lighter-appearing lamellar structure is a Pb-rich phase 830.

Figure 9A:
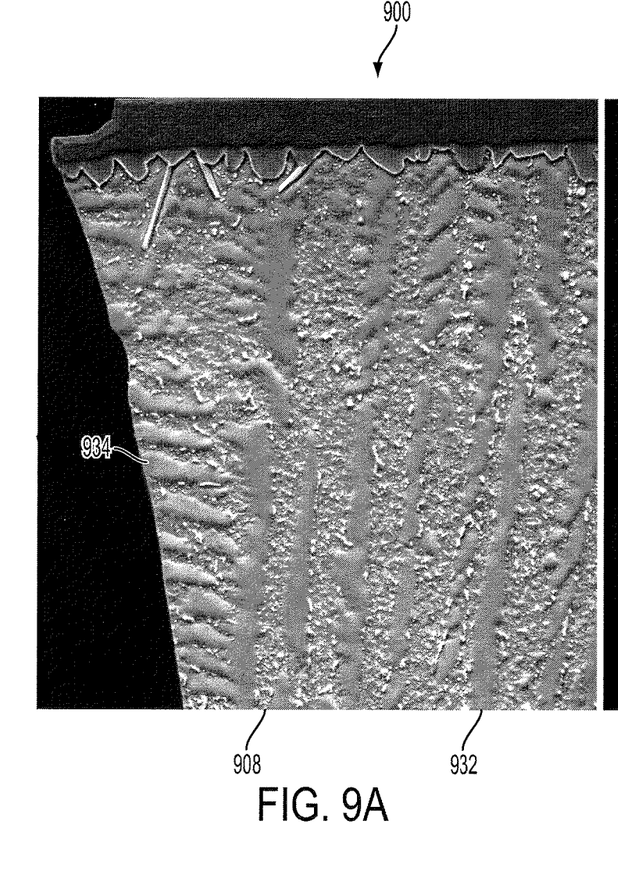
FIGS. 9A and 9B are SEM micrographs of cross-sectioned portions of still other exemplary solder bumps stretched by the process in FIGS. 1A-1E according to some embodiments.
Figure 9B:
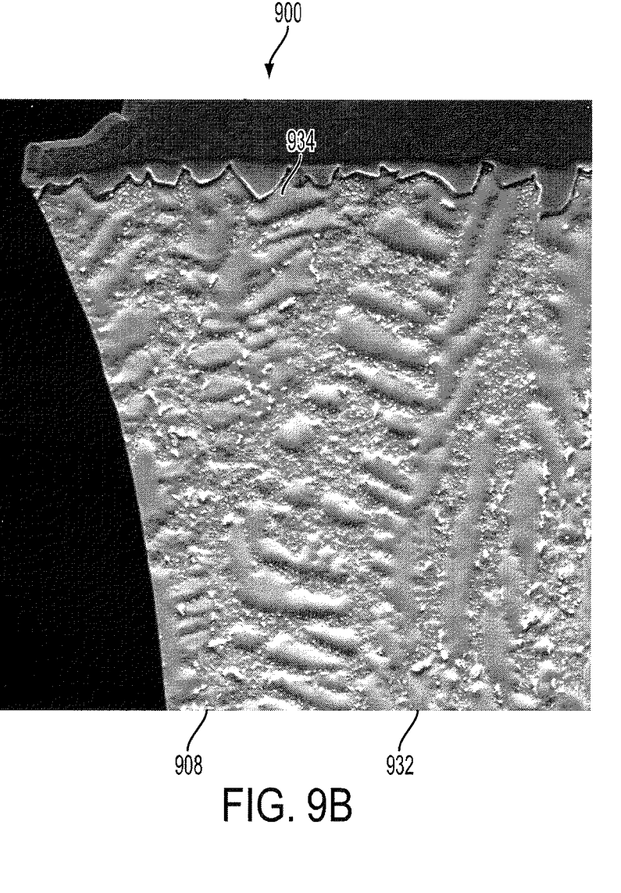

FIGS. 9A and 9B are SEM micrographs 900 of cross-sectioned portions of still other exemplary solder bumps 908 stretched by the process in FIGS. 1A-1E according to some embodiments. The solder bumps 908 contain one or more sets of lamellar structure. In some embodiments, the solder bumps 908 contain predominantly orthogonal lamellar structure 932 that is predominantly orthogonal to the pads 104 and predominantly parallel to an axis of stretching of the solder bumps 908. In some embodiments, the solder bumps 908 contain predominantly parallel lamellar structure 934 that is predominantly parallel to the pads 104 and predominantly orthogonal to the axis of stretching of the solder bumps 908. Both the predominantly orthogonal lamellar structure 932 and the predominantly parallel lamellar structure 934 are present in some embodiments. Other lamellar structure in different orientations exists in other embodiments.

Figure 10:
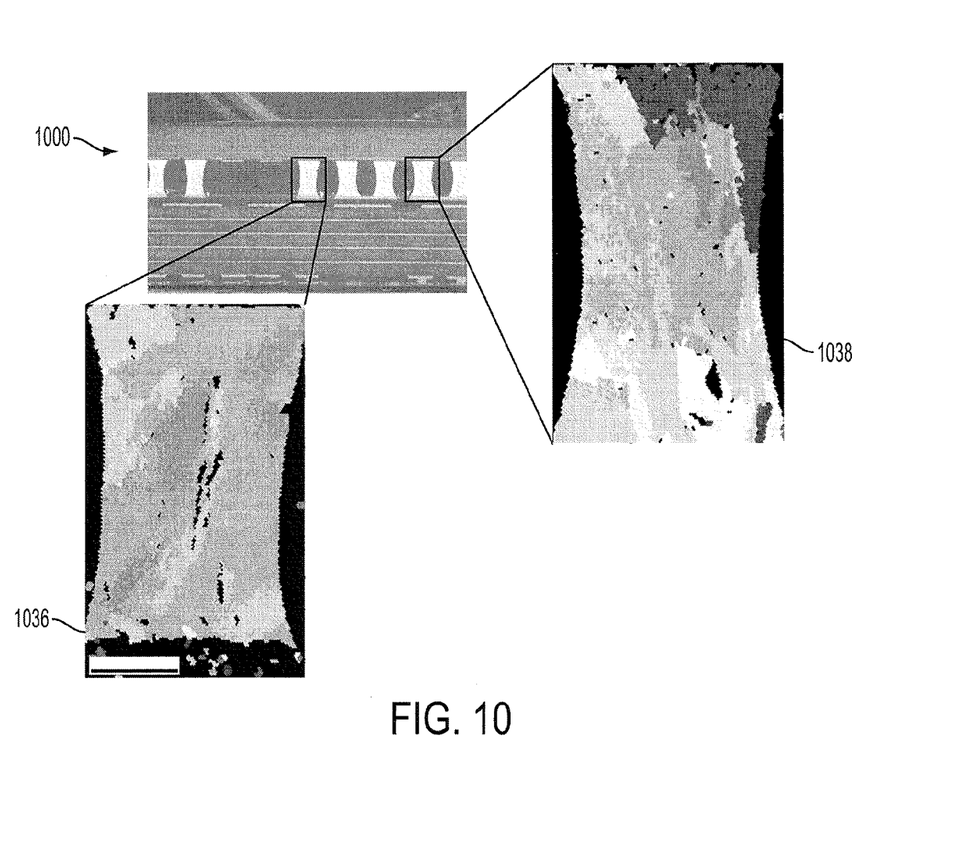
FIG. 10 is an SEM micrograph having first and second expanded portions of other cross-sectioned solder bumps stretched by the process in FIGS. 1A-1E according to some embodiments.

FIG. 10 is an SEM micrograph 1000 having first and second expanded portions of other cross-sectioned solder bumps stretched by the process in FIGS. 1A-1E according to some embodiments. The SEM micrograph 1000 includes structure corresponding to the structure in FIG. 5A, the description of which is similarly applicable and not repeated here. The SEM micrograph 1000 further includes a first expanded portion of a single solder bump 1036 and a second expanded portion of another solder bump 1038. The first expanded portion 1036 and the second expanded portion 1038 have differently shaded portions corresponding to different solder bump crystal orientations.

Figure 11:
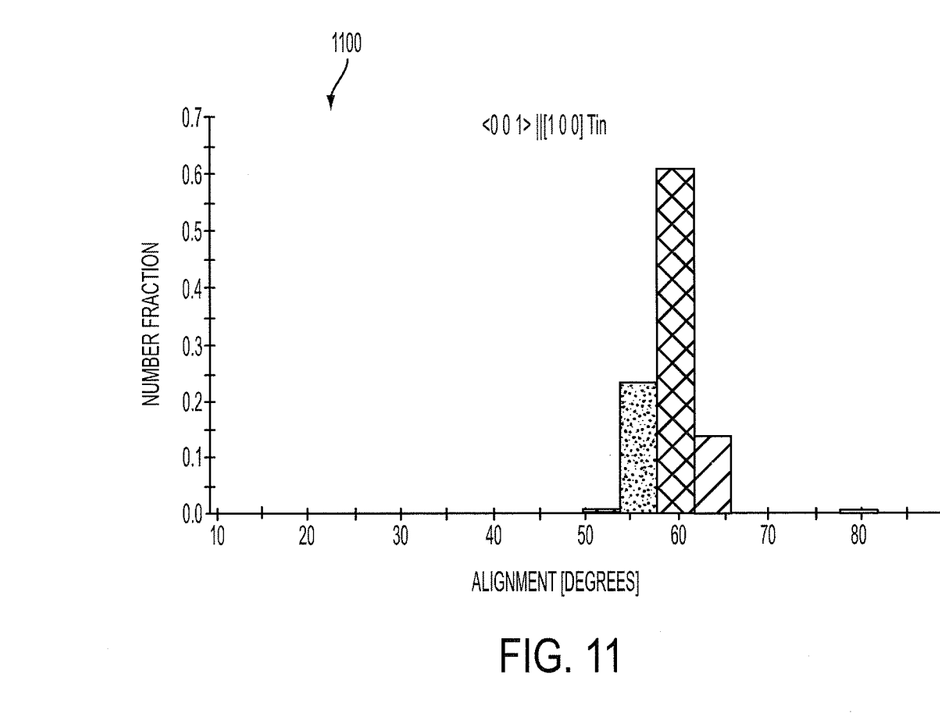
FIG. 11 is a graph of percentage versus alignment in degrees for a solder bump having different crystal grain orientations corresponding to the first expanded portion of FIG. 10.

FIG. 11 is a graph 1100 of a percentage (known here as a number of fraction) versus alignment in degrees for a solder bump having different crystal grain orientations corresponding to the first portion 1036 of FIG. 10. The alignment in degrees on the x-axis of the graph 1100 is identified in FIG. 2 as angle θ. Solder bump crystal grain orientations are grouped into four columns ranging from between slightly less than 50° to just over 65° followed by a gap and a fifth column centered near 80°. The column that includes 60 degrees has the greatest percentage of any column in FIG. 11. Lamellar crystal structure having an angle θ greater than 45° is predominantly orthogonal to an axis of stretching of the solder bump 108. Lamellar crystal structure having an angle θ less than 45° is predominantly parallel to the axis of stretching of the solder bump 108. The pattern of columns in the graph 1100 indicates the process in some embodiments result in a more ordered predominantly orthogonal crystal structure. The solder bump 108 forms a solder bump joint with c-axis orthogonal with the axis of stretching to mitigate early electromigration (EM) failure in the electrical device.

Figure 12:
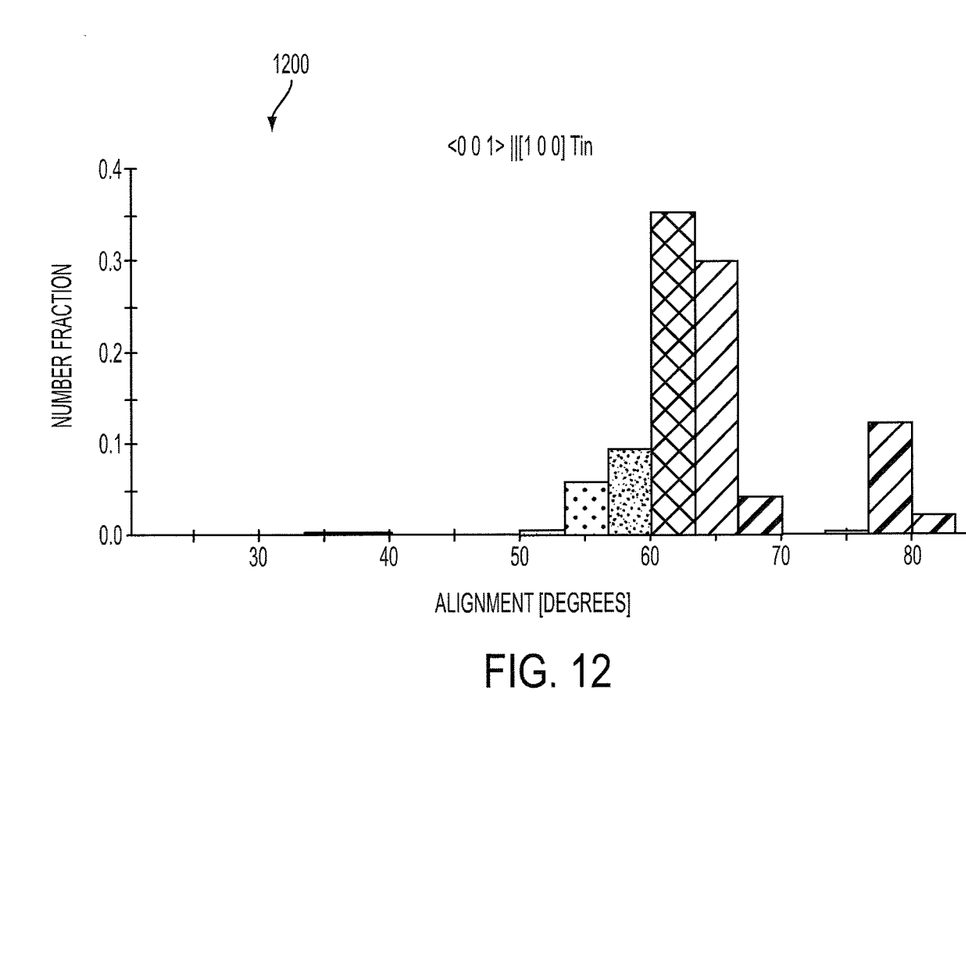
FIG. 12 is a graph of percentage versus alignment in degrees for another solder bump having different crystal grain orientations corresponding to the second expanded portion of FIG. 10.

FIG. 12 is a graph of number of a percentage (known here as a number of fraction) versus alignment in degrees for another solder bump having crystal grain orientation corresponding to the second portion 1038 of FIG. 10. Similar to FIG. 11, the alignment in degrees on the x-axis of the graph 1200 is identified in FIG. 2 as angle θ. Solder bump crystal grain orientations are shown in 11 different columns with a column that includes 62° having the greatest percentage of any column in FIG. 12. Similar to FIG. 11, the pattern of columns in the graph 1200 indicates the process in some embodiments result in a more ordered predominantly orthogonal crystal structure.

According to some embodiments, a solder bump, and stretching method for forming the solder bump, produces a novel lamellar crystal structure in the resulting solder bump joint that mitigates or eliminates premature electromigration (EM) failure by creating a solder bump joint with a preferred crystal orientation of a variety of Sn alloy grains, including at least one of Sn—Cu, Sn—Ag, Sn—Ag—Cu, Sn—Zn, Sn—Bi and Sn—Pb. While a method is disclosed that employs heating, stretching and cooling for forming the lamellar crystal structure in the resulting solder bumps, other embodiments use other means of stretching the solder joint to produce an aligned lamellar crystal structure with a preferred orientation.

According to some embodiments, a method includes heating a solder bump above a melting temperature of the solder bump. The solder bump is stretched to increase the height of the solder bump. The solder bump is cooled down.

According to some embodiments, a method of producing a solder bump joint includes heating a solder bump including tin above a melting temperature of the solder bump. The solder bump is stretched to increase the height of the solder bump. The solder bump is cooled down.

According to some embodiments, a device having a solder bump joint between a substrate having pads and a top die, includes solder bumps. The solder bumps are positioned between the pads on the substrate having pads and the top die. The solder bumps form the solder bump joint and join together the substrate having pads and the top die. The solder bumps form lamellar structures and have a contact angle of less than 90°.

According to some embodiments, a method of mitigating early electromigration failure includes heating a solder bump above a melting temperature of the solder bump. The solder bump is predominantly a eutectic Sn compound that includes at least one of Cu, Ag, Bi, Pb, Au, and Ni. The solder bump is stretched to increase the height of the solder bump. The solder bump is cooled down to form a contact angle of less than 90°. The solder bump has a lamellar structure that is predominantly orthogonal to an axis of stretching, and a ratio of an average center width spacing to an average top contact width spacing is between 0.5 and 1.0.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A device having a solder bump joint between a substrate having pads and a top die, comprising:
    solder bumps, the solder bumps positioned between the pads on the substrate having pads and the top die, the solder bumps forming the solder bump joint and joining together the substrate having pads and the top die, the solder bumps comprising lamellar structures and having a contact angle of less than 90°, wherein at least one of the lamellar structures comprises a Sn-rich phase greater than 90% Sn, and the solder bumps are predominantly a eutectic Sn—Bi compound, and the eutectic Sn—Bi compound is free of Ag.

2. The device of claim 1, wherein the lamellar structures are predominantly parallel to an axis of stretching.

3. The device of claim 1, wherein a ratio of an average center width spacing to an average top contact width spacing is between 0.5 and 1.0.

4. The device of claim 1, wherein the at least one lamellar structure includes an intermetallic compound (IMC) phase where the IMC phase is selected from at least one of: $Cu_6Sn_5$, $Ni_3Sn_4$ or $AuSn_4$.

5. The device of claim 1, wherein said tin is part of an alloy of at least one of Sn—Cu, Sn—Zn, or Sn—Bi.

6. A package comprising:
    a substrate having a top surface and a bottom surface;
    a die having a top surface and a bottom surface, wherein the bottom surface of the die faces the top surface of the substrate; and
    a solder bump electrically connected to the top surface of the substrate, wherein the solder bump is electrically connected to the bottom surface of the die, the solder bump having a center portion distal from the die and the substrate having a first average width, the solder bump having an edge portion proximate to the die or the substrate having a second average width less than the first average width, and a contact angle between the bottom surface of the die and an outer edge of the solder bump is less than 90°, and the solder bump comprises a first set of lamellar structures including a Bi-rich phase free of Ag, and a second set of lamellar structures has a different composition from the first set of lamellar structures.

7. The package of claim 6, wherein the second set of lamellar structures includes a Sn-rich phase.

8. The package of claim 6, wherein the first set of lamellar structures or the second set of lamellar structures extends parallel to the bottom surface of die.

9. The package of claim 8, wherein the first set of lamellar structures or the second set of lamellar structures extends orthogonal to the bottom surface of die.

10. The package of claim 6, wherein the first set of lamellar structures or the second set of lamellar structures extends orthogonal to the bottom surface of die.

11. The package of claim 6, wherein the substrate comprises pads on the top surface of the substrate, and the pads comprise at least one of copper, silver, electroless nickel immersion gold, or electroless nickel electroless palladium immersion gold.

12. The package of claim 6, wherein the solder bump has a crystal angle between a normal of the top surface of the substrate and a short crystal axis of the solder bump greater than 50°.

13. A package comprising:
    a substrate having a top surface;
    a pad on the top surface of the substrate;
    a die having a bonding surface, wherein the bonding surface of the die faces the top surface of the substrate; and
    a solder bump electrically connected to the pad, wherein the solder bump is electrically connected to the bonding surface of the die, the solder bump has a crystal angle between a normal of the top surface of the substrate and a short crystal axis of the solder bump greater than 50°, a contact angle between the bottom surface of the die and an outer edge of the solder bump is less than 90°, the solder bump comprises a plurality of sets of lamellar structures, and a first set of lamellar structures of the plurality of lamellar structures has a first composition, a second set of lamellar structures of the plurality of lamellar structures has a second composition different from the first composition, and the first composition and the second composition are free of Ag.

14. The package of claim 13, wherein a set of lamellar structures of the plurality of lamellar structures is oriented parallel to the top surface of the substrate, and another set of lamellar structures of the plurality of lamellar structures is oriented perpendicular to the top surface of the substrate.

15. The package of claim 13, wherein the first composition is a Sn-rich composition.

16. The package of claim 15, wherein the Sn-rich composition includes greater than 90% Sn.

17. The package of claim 15, wherein the second composition is a Bi-rich composition.

18. The package of claim 15, wherein the first composition includes a Sn—Pb alloy.

19. The package of claim 15, wherein at least one set of lamellar structures of the plurality of sets of lamellar structures includes an intermetallic compound (IMC) phase selected from at least one of: $Cu_6Sn_5$, $Ni_3Sn_4$ or $AuSn_4$.

20. The package of claim 15, wherein at least one set of lamellar structures of the plurality of sets of lamellar structures includes an alloy of at least one of Sn—Cu, Sn—Zn, or Sn—Bi.

* * * * *